(12) United States Patent
Kay

(10) Patent No.: US 6,229,395 B1
(45) Date of Patent: May 8, 2001

(54) DIFFERENTIAL TRANSCONDUCTANCE AMPLIFIER

(75) Inventor: Michael R. Kay, Summerfield, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 09/411,615

(22) Filed: Oct. 1, 1999

(51) Int. Cl.[7] ......................................................... H03F 3/45
(52) U.S. Cl. ........................... 330/252; 330/254; 327/359
(58) Field of Search ..................................... 330/252, 254, 330/261; 327/359; 331/182, 183

(56) References Cited

U.S. PATENT DOCUMENTS

| | | | |
|---|---|---|---|
| 5,515,014 | 5/1996 | Troutman | 332/178 |
| 5,521,545 * | 5/1996 | Terry et al. | 327/359 |
| 5,563,545 | 10/1996 | Scheinberg | 327/389 |
| 5,570,056 | 10/1996 | Groe | 327/359 |
| 5,587,687 | 12/1996 | Adams | 330/253 |
| 5,625,307 | 4/1997 | Scheinberg | 327/113 |
| 5,675,392 | 10/1997 | Nayebi et al. | 348/584 |
| 5,768,700 | 6/1998 | Kardontchik | 455/333 |
| 5,847,623 * | 12/1998 | Hadjichristos | 332/105 |
| 6,002,860 * | 12/1999 | Voinigescu et al. | 395/500.35 |
| 6,043,710 * | 12/1999 | Smith et al. | 330/254 |
| 6,084,469 * | 7/2000 | Lorenz | 330/252 |

OTHER PUBLICATIONS

Product Data Sheet RF9908, RF Micro Devices, Inc., believed to be prior art.
Product Data Sheet RF2411, RF Micro Devices, Inc., believed to be prior art.

* cited by examiner

Primary Examiner—Robert Pascal
Assistant Examiner—Henry Choe
(74) Attorney, Agent, or Firm—Rhodes & Mason, P.L.L.C.

(57) ABSTRACT

A differential transconductance amplifier circuit includes a transistor differential pair. In the case of bipolar transistors, each transistor has a base, an emitter and a collector. An alternating current input port includes first and second lines receiving alternating current at a frequency with the first alternating current line tied to the base of one of the transistors and the second alternating current line tied to the base of the other of the transistors. A degeneration feedback circuit connects the emitters of the transistors and includes two inductive impedances with a capacitive impedance between them. The inductive and capacitive impedances have values so as to resonate at about the frequency of the alternating current, and a resistance in series with the series of inductive and capacitive impedances de-Q's resonance of the series of inductive and capacitive impedances. Bias current sources are connected between the capacitive impedance and each of the inductive impedances so that the emitter currents of the differential amplifier transistors are the currents in the bias current sources.

32 Claims, 4 Drawing Sheets

DIFFERENTIAL TRANSCONDUCTANCE AMPLIFIER

BACKGROUND OF THE INVENTION

The present invention relates to the use of a transistor differential pair and its use as the input to many integrated circuit amplifiers. It has specific application to Radio Frequency Integrated Circuit (RFIC) amplifiers and double balanced (Gilbert cell) mixers, as well as many other possible uses. Such mixers are used in numerous applications, including, but not limited to, upconverters and downconverters for cellular or other wireless communications.

A conventional differential amplifier is shown in FIG. 1, and a typical double balanced mixer is shown in FIG. 2. Though these examples show bipolar transistors, the analysis is identical for Field Effect Transistors (FETs i.e., MOSFETS, MESFETS, JFETS . . . ), and this invention is applicable to both bipolar and field effect transistor circuits. These examples also show resistive loads $RL_1$, $RL_2$, $RL_3$ and $RL_4$, but there are a wide variety of loads that could be used, for example, current combiners, transformers, inductors, tuned networks and similar circuits.

As seen in FIG. 1, transistors $Q_1$ and $Q_2$ have their emitters tied and supplied through current source CS1. An input voltage, $VIN_1$, is applied across their bases, and a collector voltage $VCC_1$ applied through load resistors $RL_1$ and $RL_2$ determines the output signal $VOUT_1$ as the amplified differential of $VIN_1$.

In FIG. 2, the Gilbert cell has transistors $Q_5$, $Q_6$, $Q_7$, and $Q_8$ arranged with the emitters of $Q_5$ and $Q_6$ tied together and the emitters of $Q_7$ and $Q_8$ tied together. The bases of $Q_6$ and $Q_7$ receive one side of local oscillator signal $LO\_IN_1$, and the bases of $Q_5$ and $Q_8$ receive the other pole of $LO\_IN_1$. The collectors of $Q_6$ and $Q_7$ are tied as one pole of the output signal $VOUT_2$, and the collectors of $Q_6$ and $Q_8$ are tied as the other output polarity of $VOUT_2$. The two tied collector pairs are connected respectively through load resistors $RL_3$ and $RL_4$ to the collector voltage supply $VCC_2$.

The tied emitters of $Q_5$ and $Q_6$ are connected to the collector of transistor $Q_3$ and the tied emitters of $Q_7$ and $Q_8$ are connected to the collector of transistor $Q_4$. Input signal $VIN_2$ is connected across the bases of $Q_3$ and $Q_4$. The emitters of transistors $Q_3$ and $Q_4$ are tied to a constant current source $CS_2$.

As can be seen, the transistors $Q_3$ and $Q_4$ act as a differential amplifier component of the Gilbert cell circuit, which on the whole acts to multiply the voltage $VIN_2$ by the local oscillator signal $LO\_IN_1$ to provide the output signal $VOUT_2$.

The small signal gain of circuit in FIG. 1 is: $gm*RL_1$. (Small signal is defined to be about 10 mV or less.) For input signals larger than about 50 mV, the differential input pair suffers from linearity problems. The typical solution to this problem is to "degenerate" the input pair. This is done by adding impedance $Z_1$ as shown in FIG. 3 or FIG. 4, which show the amplifier sections only, for simplicity.

In FIG. 3, two identical impedances $Z_1$ have been interposed between the transistor emitters and the current source $CS_1$. In FIG. 4, two current sources $CS_3$ and $CS_4$ are provided, one tied to each transistor emitter, with the two emitters coupled through an impedance equal to twice $Z_1$.

The equivalent gm of the input pair changes to: $Gm=1/(1(/gm)+Z_1)$. If $Z_1$ is large compared to $1/gm$ (which is typically the case), than the gain is dominated by this degeneration impedance. The gain is also less than it was without the degeneration, but the input dynamic range will be greater.

The circuit in FIG. 3 tends to have less noise than that of FIG. 4, because the noise contribution from the bias current source $CS_1$ is common-moded out. But, FIG. 3 has the disadvantage in that, if $Z_1$ is resistive, DC current flows through this impedance, and a substantial voltage drop will result, reducing the dynamic range. Also, since DC current must flow, $Z_1$ can not be capacitive. One common solution to this problem is to make $Z_1$ purely inductive, or use the circuit in FIG. 4. The problem with using the FIG. 3 circuit with $Z_1$ purely inductive is that at lower frequencies, the impedance becomes less, and therefore gain becomes greater. This causes lower frequency noise, especially at the image frequency, to be gained up more than the signal frequency of interest.

The circuit in FIG. 4 solved the problem of DC current flowing through the degeneration by adding a second current source. The big problem with this approach is that the noise from the current sources is no longer common-moded out, and can add substantial noise to the entire amplifier and/or mixer. Thus, prior degeneration efforts have been plagued with one detrimental side effect or another, leaving an unresolved need.

SUMMARY OF THE INVENTION

The present invention fulfills this need in the art by providing a differential transconductance amplifier circuit including a transistor differential pair having an output and an alternating current input port with a degeneration feedback circuit that includes a series of inductive and capacitive impedances. The transistors may be field effect transistors or bipolar transistors.

The amplifier preferably includes a resistance in series with the series of inductive and capacitive impedances to de-Q resonance of the series of inductive and capacitive impedances. Typically, the differential transistor pair is arranged with the alternating current input port as the bases of the transistors.

An oscillator may be included to generate a frequency signal at the alternating current input and the series of inductive and capacitive impedances preferably have values so as to resonate at about the frequency signal. In one embodiment the frequency signal is in the radio frequency band. Other frequencies can be used.

The series of inductive and capacitive impedances preferably includes two inductive impedances with a capacitive impedance between them. Conductors may be connected between the capacitive impedance and each of the inductive impedances so that the currents of the differential amplifier transistors are determined by currents in the conductors. Typically, the conductors are connected to bias current sources so that the currents are determined by the bias current sources.

In a preferred embodiment, the alternating current input port includes first and second lines, the pair of transistors is arranged with the first alternating current line as the base of one of the transistors, the second alternating current line as the base of the other of the transistors, and the emitters of the transistors are connected to bias current sources through the degeneration feedback circuit.

The invention also provides a differential transconductance amplifier circuit including a Gilbert cell having an intermediate frequency port, a local oscillator port and a frequency port, with the Gilbert cell including a differential amplifier with a degeneration circuit that includes a series of inductive and capacitive impedances. An oscillator may be included to generate a frequency signal supplied to the frequency port and the series of inductive and capacitive impedances typically have values so as to resonate at about the frequency signal.

In a preferred embodiment the Gilbert cell includes two pairs of transistors, the intermediate frequency port includes first and second lines, with the second intermediate frequency line tied to a collector of one transistor of each pair and the first intermediate frequency line tied to a collector of the other transistor of each pair. The local oscillator port includes first and second lines, with the second oscillator line tied to a base of one transistor of each pair and the first oscillator line tied to a base of the other transistor of each pair.

The frequency port may include first and second lines, with the differential amplifier including a pair of transistors arranged with the first frequency line tied to the base of one of the differential amplifier transistors and the second radio frequency line tied to the base of the other of the differential amplifier transistors, and a collector of each of the differential amplifier transistors is electrically connected to the emitters of one pair of the transistors of the Gilbert cell.

More preferably, an oscillator oscillates at a frequency signal, the differential amplifier includes a pair of transistors and the degeneration circuit links emitters of the differential amplifier transistors and includes two inductive impedances with a capacitive impedance in series between them, with the inductive and capacitive impedances having values so as to resonate at a frequency about the frequency signal. A resistance in series with the series of inductive and capacitive impedances de-Q's resonance of the inductive and capacitive impedances, and conductors connected between the capacitive impedance and each of the inductive impedances provide the emitter currents of the differential amplifier transistors.

The invention also provides a method of differential amplification including providing a transistor differential pair with a signal across their collectors, supplying alternating current at a frequency at the bases of the transistors, supplying current at the emitters of the transistors from two current sources through inductive impedances, and capacitively coupling the current sources to permit resonance between the emitters. The method preferably includes having the permitted resonance at about the frequency of the alternating current. More preferably, the permitted resonance is damped to be de-Q'ed.

When using field effect transistors, the invention arranges the field effect transistors as above, replacing emitters with sources, bases with gates, and collectors with drains.

BRIEF DESCRIPTION OF THE DRAWINGS

The invention will be better understood after a reading of the Detailed Description of the Preferred Embodiments and a review of the drawings in which.

DETAILED DESCRIPTION OF THE PREFERRED EMBODIMENTS

Figure 4:
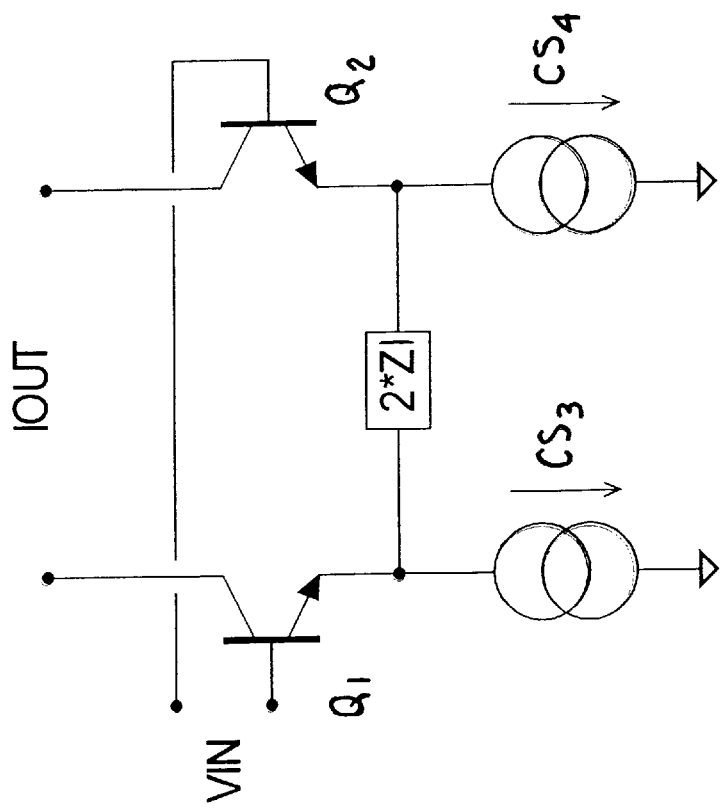
FIGS. 3 and 4 are circuit diagrams of prior art differential amplifier components to which degeneration impedances have been added.
Figure 3:
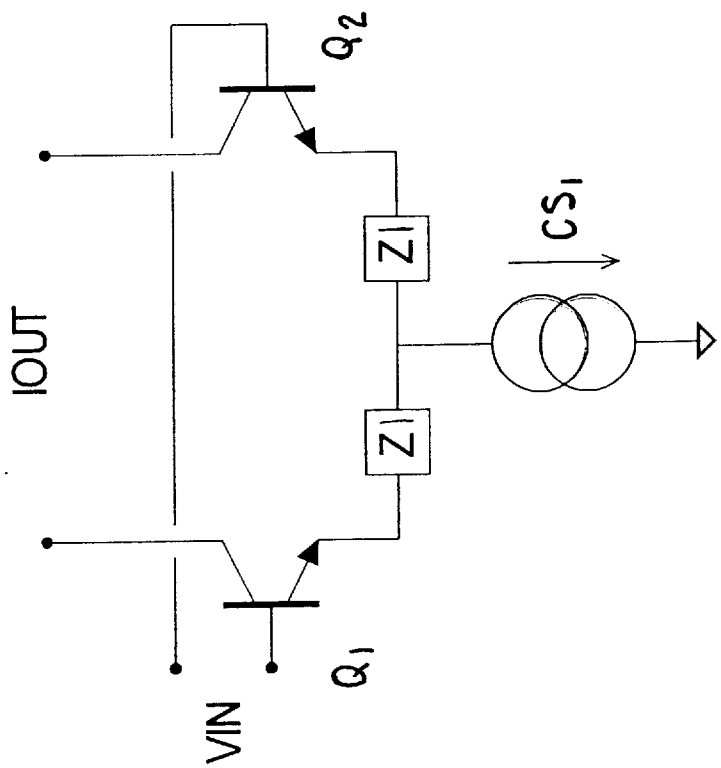
Figure 5:
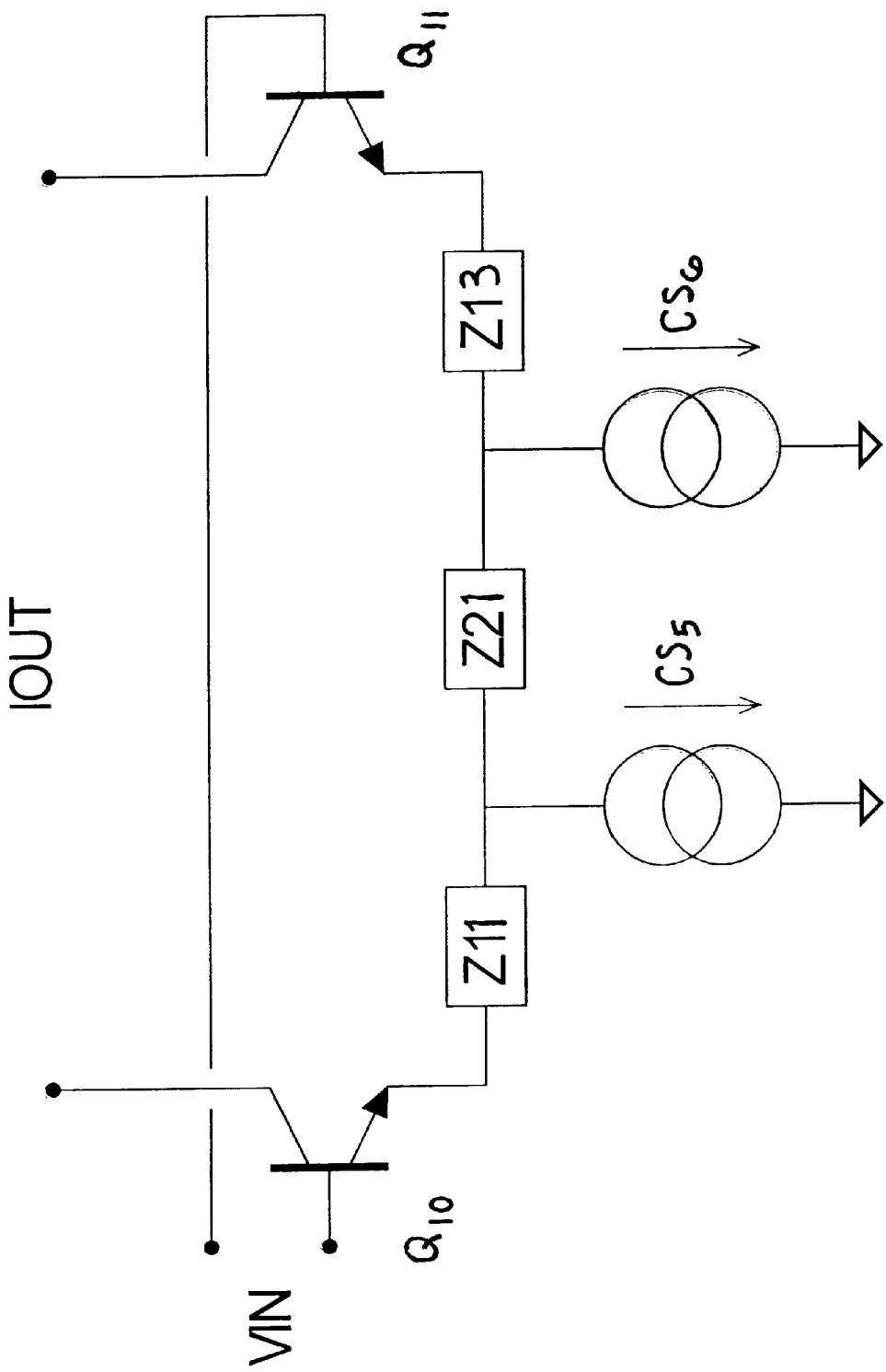
FIG. 5 is a diagram of a differential amplifier component to which degeneration impedances have been added in accordance with the invention.

The circuit in FIG. 5 solves the above stated problems without introducing any new disadvantages. In FIG. 5, the transistors $Q_{10}$ and $Q_{11}$ are configured in an amplifier circuit as with the prior art circuits, with the differences appearing in the configuration of the degeneration circuit. Thus, the transistors $Q_{10}$ and $Q_{11}$ have their emitters tied through the series of inductive impedance Z11, capacitive impedance Z21, and inductive impedance Z13. Preferably, the inductive impedances Z11 and Z13 are identical. If the values of Z11, Z13 and Z21 are chosen properly, this new circuit has the advantages of the circuits in FIGS. 3 and 4 and eliminates the disadvantages. The values are preferably chosen to yield a circuit that resonates at the frequency applied as VIN to the bases of the transistors. With Z11 and Z13 chosen to be inductance, and Z21 chosen to be capacitance, there will be no DC drop across Z11, Z13 or Z21, and the values can be chosen to resonate at the frequency of interest, thereby attenuating all other frequencies. Input dynamic range of the amplifier can be increased by adding some resistance to either Z11 and Z13 or Z21 to "de-Q" the resonance. This also improves the producibility of the product.

Figure 6:
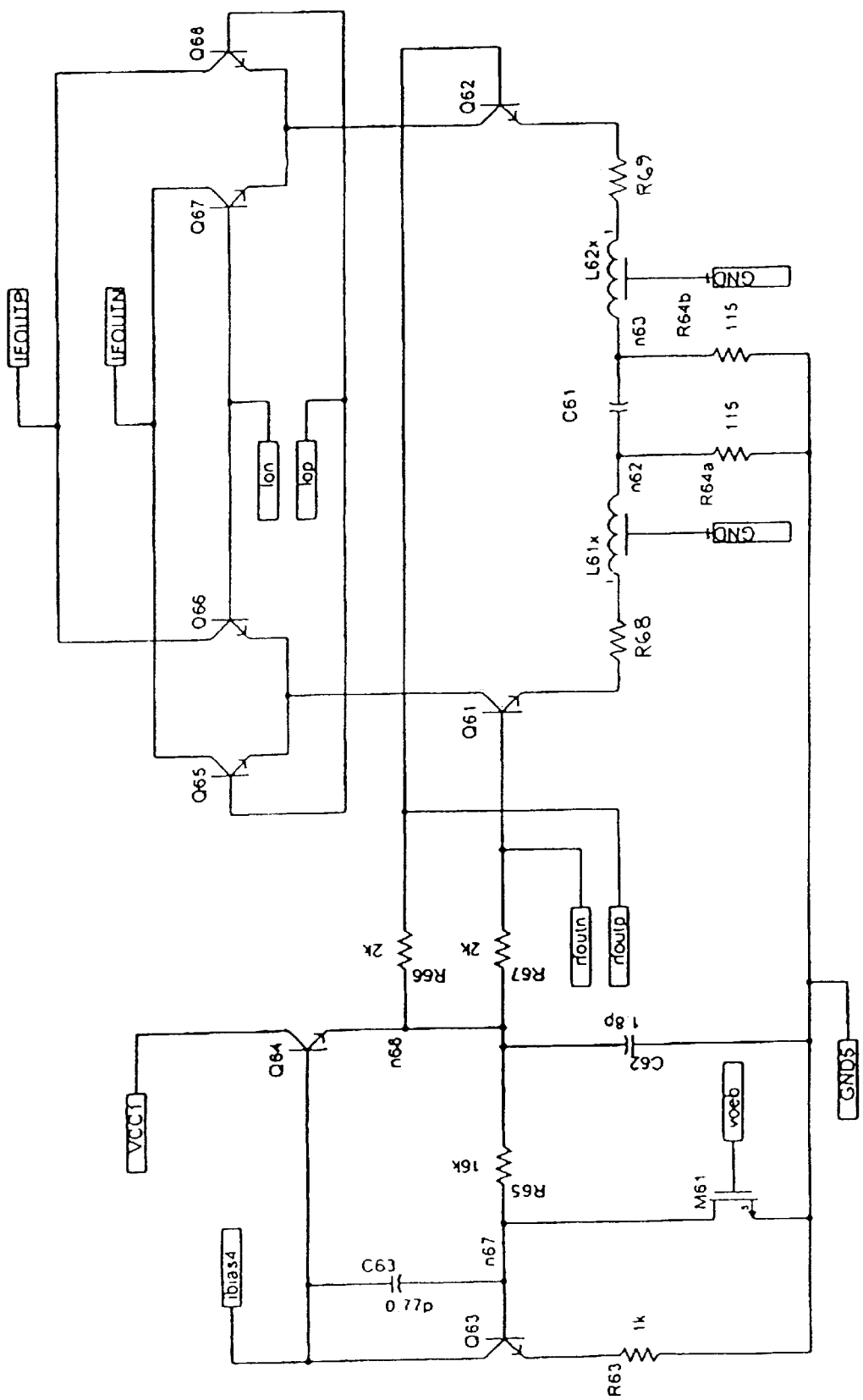
FIG. 6 is a diagram of a circuit including a double balanced mixer to which degeneration impedances have been added in accordance with the invention.

FIG. 6 shows a preferred embodiment of the invention in a double balanced, Gilbert cell mixer. In FIG. 6, the Gilbert cell has transistors $Q_{65}$, $Q_{66}$, $Q_{67}$, and $Q_{68}$ arranged with the emitters of $Q_{65}$ and $Q_{66}$ tied together and the emitters of $Q_{67}$ and $Q_{68}$ tied together. The bases of $Q_{66}$ and $Q_{67}$ receive one side, lon, of a local oscillator signal, and the bases of $Q_{65}$ and $Q_{68}$ receive the other polarity, lop. The collectors of $Q_{65}$ and $Q_{67}$ are tied as one of the signal IFOUTN, and the collectors of $Q_{66}$ and $Q_{68}$ are tied as the other polarity, IFOUTP.

The tied emitters of $Q_{65}$ and $Q_{66}$ are connected to the collector of transistor $Q_{61}$ and the tied emitters of $Q_{67}$ and $Q_{68}$ are connected to the collector of transistor $Q_{62}$. Input signals rfoutn and rfoutp are connected across the bases of $Q_{61}$ and $Q_{62}$. The emitters of transistors $Q_{61}$ and $Q_{62}$ are tied through resistors R68 and R69, inductive impedances L61x and L62x to current source resistors R64a and R64b. The values of L61x, L62x and C61 (Z11, Z21 and Z13) are selected to resonate at the RFOUT frequency (2.4 GHz), which is applied across the bases of the differential amplifier transistors $Q_{61}$ and $Q_{62}$. The 7 Ω resistors R68 and R69 in series with each inductor de-Q the resonance. The bias current sources are resistors R64a and R64b, tied to ground in this embodiment. The noise in these resistors (R64a and R64b) is partially common-moded out.

Figure 2:
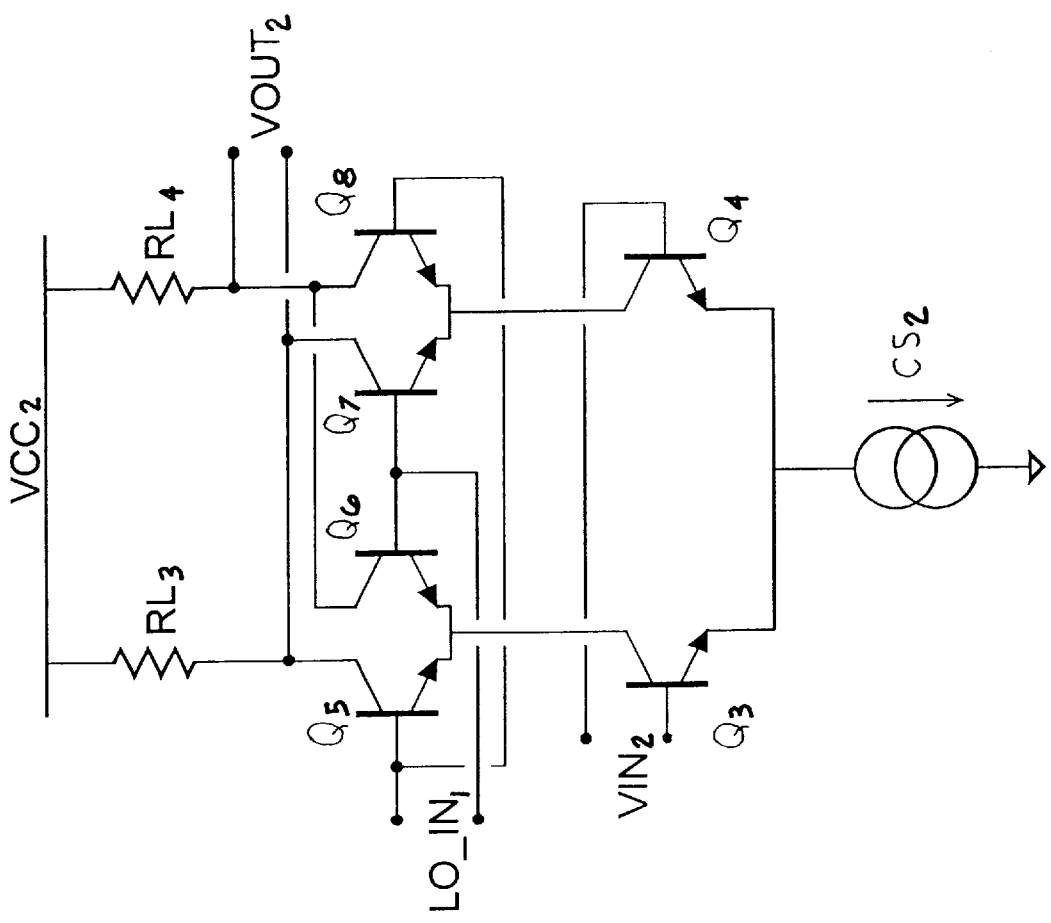
FIG. 2 is a circuit diagram of a prior art double balanced mixer.
Figure 1:
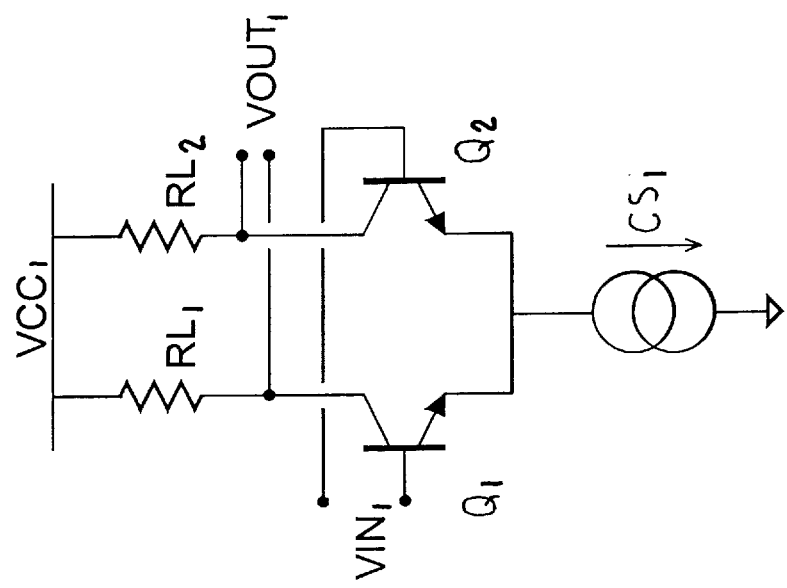
FIG. 1 is a circuit diagram of a prior art differential amplifier.

The Gilbert cell transistors $Q_{65}$, $Q_{66}$, $Q_{67}$ and $Q_{68}$ operate as described above with reference to FIG. 2. The cell can be configured in various circuits including upconverters like chip RF9938, a PCS upconverter/BPSK modulator made and sold by RF Micro Devices, Greensboro, N.C. It can also be configured into a downconverter such as the RF2456 CDMA/FM downconverter, also made by RF Micro Devices.

As will be apparent to those of ordinary skill in the art, degenerated differential amplifier circuits can be included in circuits differing from those specifically shown, as desired to configure the circuit as an upconverter, a downconverter, or for other circuit applications.

The degeneration circuits of FIGS. 5 and 6 solve numerous problems:

As compared with circuits with no degeneration, input dynamic range (linearity) is improved.

The noise accompanying resistive degeneration (either from resistors, current source biases, or both) is avoided.

The undesired amplification of lower frequency signals more than the signal of interest that is typical of purely inductive degeneration is avoided.

In addition, the degeneration technique of the present invention provides several advantages:

The peak gain is at the frequency of interest and is attenuated at other frequencies.

It improves IP3 (third-order intercept point: a virtual measurement of the signal strength at which the power of the 3rd-order distortion energy of the gain stage is as strong as the fundamental signal energy), in the presence of out-of-band signals.

The chance of high (or low) frequency oscillations is reduced.

IF noise is reduced.

Any noise from current bias sources (R64a, R64b) is partially common-moded out.

Also, the circuit helps reject image noise.

The degeneration circuit has numerous uses, including differential input (double balanced) mixers (Gilbert cell type), simple differential pair amplifier stages, and possible common emitter amplifier stages.

As noted above, the invention can be carried out using field effect transistors as well as bipolar transistors, in which case the field effect transistor source would be configured in circuits as noted above where the bipolar transistor emitter is located, and the drain would be positioned in place of the collector. The connections to the base of the bipolar transistors mentioned above would be applied to the gate of a field effect transistor.

Certain modifications and improvements will occur to those skilled in the art upon a reading of the foregoing description. It should be understood that all such modifications and improvements have been deleted herein for the sake of conciseness and readability but are properly within the scope of the following claims:

What is claimed is:

1. A differential transconductance amplifier circuit comprising a transistor differential pair having an output and an alternating current input port with a degeneration feedback circuit that includes a series of inductive and capacitive impedances and a resistance in series with the series of inductive and capacitive impedances to de-Q resonance of the series of inductive and capacitive impedances, such that the capacitive impedance is not part of a current source.

2. A differential transconductance amplifier as claimed in claim 1 wherein the transistors are field effect transistors.

3. A differential transconductance amplifier as claimed in claim 1 wherein the transistors are bipolar transistors.

4. A differential transconductance amplifier as claimed in claim 1 wherein the differential transistor pair is arranged with the alternating current input port as the bases of the transistors.

5. A differential transconductance amplifier as claimed in claim 1 further comprising an oscillator generating a frequency signal at the alternating current input and wherein the series of inductive and capacitive impedances have values so as to resonate at about the frequency signal.

6. A differential transconductance amplifier as claimed in claim 5 wherein the frequency signal is in the radio frequency band.

7. A differential transconductance amplifier as claimed in claim 1 wherein the series of inductive and capacitive impedances includes two inductive impedances with a capacitive impedance between them.

8. A differential transconductance amplifier as claimed in claim 7 further comprising conductors connected between the capacitive impedance and each of the inductive impedances so that the currents of the differential amplifier transistors are determined by currents in the conductors.

9. A differential transconductance amplifier as claimed in claim 8 wherein the conductors are connected to bias current sources so that the currents are determined by the bias current sources.

10. A differential transconductance amplifier as claimed in claim 1 wherein the alternating current input port includes first and second lines, the pair of transistors is arranged with the first alternating current line as the base of one of the transistors and the second alternating current line as the base of the other of the transistors, and the emitters of the transistors are connected to bias current sources through the degeneration feedback circuit.

11. A differential transconductance amplifier as claimed in claim 1 wherein the alternating current input port includes first and second lines, and the pair of transistors are field effect transistors arranged with the first alternating current line as the gate of one of the transistors and the second alternating current line as the gate of the other of the transistors, and the sources of the transistors are connected to bias current sources through the degeneration feedback circuit.

12. A differential transconductance amplifier circuit comprising:

a transistor differential pair, each transistor having a base, an emitter and a collector, an alternating current input port including first and second lines receiving alternating current at a frequency with the first alternating current line tied to the base of one of the transistors and the second alternating current line tied to the base of the other of the transistors, a degeneration feedback circuit connecting the emitters of the transistors and including two inductive impedances with a capacitive impedance between them, the inductive and capacitive impedances having values so as to resonate at about the frequency of the alternating current and a resistance in series with the series of inductive and capacitive impedances to de-Q resonance of the series of inductive and capacitive impedances, and bias current sources connected between the capacitive impedance and each of the inductive impedances so that the emitter currents of the differential amplifier transistors are the currents in the bias current sources.

13. A differential transconductance amplifier circuit comprising:

a Gilbert cell having an intermediate frequency port, a local oscillator port and a frequency port, the Gilbert cell including a differential amplifier with a degeneration circuit that includes a series of inductive and capacitive impedances and a resistance in series with the series of inductive and capacitive impedances to de-Q resonance of the series of inductive and capacitive impedances, such that the capacitive impedance is not part of a current source.

14. A differential transconductance amplifier as claimed in claim 13, further comprising an oscillator generating a frequency signal supplied to the frequency port and wherein the series of inductive and capacitive impedances have values so as to resonate at about the frequency signal.

15. A differential transconductance amplifier as claimed in claim 13 wherein the frequency signal is within the radio frequency band.

16. A differential transconductance amplifier as claimed in claim 13 wherein the differential amplifier comprises a pair of transistors arranged with the frequency port as the bases of the transistors.

17. A differential transconductance amplifier as claimed in claim 13 wherein the series of inductive and capacitive impedances includes two inductive impedances with a capacitive impedance between them.

18. A differential transconductance amplifier as claimed in claim 17 further comprising conductors connected between the capacitive impedance and each of the inductive impedances so that the emitter currents of the differential amplifier transistors are the currents in the conductors.

19. A differential transconductance amplifier as claimed in claim 13 wherein the Gilbert cell includes two pairs of transistors, the intermediate frequency port includes first and second lines, with the second intermediate frequency line tied to a collector of one transistor of each pair and the first intermediate frequency line tied to a collector of the other transistor of each pair, and the local oscillator port includes first and second lines, with the second oscillator line tied to a base of one transistor of each pair and the first oscillator line tied to a base of the other transistor of each pair.

20. A differential transconductance amplifier as claimed in claim 18 wherein the frequency port includes first and second lines, the differential amplifier comprises a pair of transistors arranged with the first frequency line tied to the base of one of the differential amplifier transistors and the second radio frequency line tied to the base of the other of the differential amplifier transistors, and a collector of each of the differential amplifier transistors is electrically connected to the emitters of one pair of the transistors of the Gilbert cell.

21. A differential transconductance amplifier as claimed in claim 13 wherein an oscillator oscillates at a frequency signal, the differential amplifier includes a pair of transistors and the degeneration circuit links emitters of the differential amplifier transistors and includes a) two inductive impedances with a capacitive impedance in series between them, with the inductive and capacitive impedances having values so as to resonate at a frequency at about the frequency signal, b) a resistance in series with the series of inductive and capacitive impedances to de-Q resonance of the inductive and capacitive impedances, and c) conductors connected between the capacitive impedance and each of the inductive impedances so that the emitter currents of the differential amplifier transistors are the currents in the conductors.

22. A differential transconductance amplifier for a radio frequency circuit comprising a Gilbert cell including:

a. first and second pairs of transistors, b. an intermediate frequency port including first and second lines, with the second intermediate frequency line tied to a collector of one transistor of each pair and the first intermediate frequency line tied to a collector of the other transistor of each pair, c. a local oscillator port including first and second lines, with the second oscillator line tied to a base of one transistor of each pair and the first oscillator line tied to a base of the other transistor of each pair, and d. a differential amplifier including i) a third pair of transistors, ii) a collector of each of the transistors of the third pair of transistors being electrically connected to tied emitters of one of the first and second pairs of transistors, iii) a radio frequency port including first and second lines with the first radio frequency line tied to a base of one of the third pair of transistors and the second radio frequency line tied to a base of the other of the third pair of transistors, and iv) a degeneration circuit that connects emitters of the third pair of transistors and includes a) a series of inductive and capacitive impedances, including two inductive impedances with a capacitive impedance between them, wherein the series of inductive and capacitive impedances have values so as to resonate at about the frequency on the radio frequency lines, b) a resistance in series with the series of inductive and capacitive impedances to de-Q resonance of the series of inductive and capacitive impedances, and c) conductors connected between the capacitive impedance and each of the inductive impedances so that the emitter currents of the differential amplifier transistors are determined by currents in the conductors.

23. A differential transconductance amplifier circuit comprising:

a Gilbert cell having:

a differential amplifier that includes a pair of field effect transistors, each of which has a source, a drain and a gate, and a degeneration circuit that includes a series of inductive and capacitive impedances and a resistance in series with the series of inductive and capacitive impedances to de-Q resonance of the series of inductive and capacitive impedances, such that the capacitive impedance is not part of a current source.

24. A differential transconductance amplifier as claimed in claim 23 wherein the series of inductive and capacitive impedances includes two inductive impedances with a capacitive impedance between them.

25. A differential transconductance amplifier as claimed in claim 23 further comprising conductors connected between the capacitive impedance and each of the inductive impedances so that the drain currents of the differential amplifier transistors are the currents in the conductors.

26. A differential transconductance amplifier as claimed in claim 23 wherein the Gilbert cell includes two pairs of field effect transistors that each have a source, a drain and a gate, an intermediate frequency port to the Gilbert cell includes first and second lines, with the second intermediate frequency line connected to the drain of one transistor of each pair and the first intermediate frequency line connected to the drain of the other transistor of each pair, and an oscillator port to the Gilbert cell includes first and second lines, with the second oscillator line tied to a gate of one transistor of each pair and the first oscillator line tied to a gate of the other transistor of each pair.

27. A differential transconductance amplifier as claimed in claim 23 wherein the differential amplifier has an alternating current signal port including first and second lines, the pair of field effect transistors is arranged with the first alternating current signal line as the gate of one of the transistors and the second alternating current signal line as the gate of the other of the transistors, the sources of the transistors are connected to bias current sources through the inductors of the degeneration circuit, and the drains of the transistors provide an output.

28. A method of differential amplification comprising:

providing a transistor differential pair with a signal across their collectors, supplying alternating current at a frequency at the bases of the transistors, supplying current at the emitters of the transistors from two current sources through inductive impedances, and capacitively coupling the current sources to permit resonance between the emitters.

29. A method as claimed in claim 25 wherein the permitted resonance is at about the frequency of the alternating current.

30. A method as claimed in claim 26 wherein the permitted resonance is damped to be de-Q'ed.

31. A method of differential amplification comprising:

providing a differential pair of field effect transistors, supplying alternating current at a frequency at the gates of the transistors, supplying current at the sources of the transistors from two current sources through inductive impedances, and capacitively coupling the current sources to permit resonance between the sources of the transistors.

32. A method as claimed in claim 31 wherein the permitted resonance is at the frequency of the alternating current.

* * * * *